United States Patent [19]
Johnson et al.

[11] Patent Number: 6,125,107
[45] Date of Patent: Sep. 26, 2000

[54] DUAL-BAND RF TEST INTERFACE CIRCUIT

[75] Inventors: Lawrence W. Johnson, Santee; Jeffrey L. Bartlett, San Diego, both of Calif.

[73] Assignee: QUALCOMM Incorporated, San Diego, Calif.

[21] Appl. No.: 08/960,172

[22] Filed: Oct. 29, 1997

[51] Int. Cl.[7] .......................... G01R 31/08; G06F 11/00; H01P 5/12; H03H 9/00

[52] U.S. Cl. ..................... 370/241; 333/126; 333/129; 333/132; 379/27

[58] Field of Search ..................................... 370/241, 275, 370/276, 341, 342; 333/100, 126, 129, 132, 134; 379/1, 27

[56] References Cited

U.S. PATENT DOCUMENTS

| | | | |
|---|---|---|---|
| 5,386,203 | 1/1995 | Ishihara | 333/129 |
| 5,504,800 | 4/1996 | Yehushua et al. | 379/27 |
| 5,652,599 | 7/1997 | Pitta et al. | 343/858 |
| 5,732,330 | 3/1998 | Anderson et al. | 455/76 |

FOREIGN PATENT DOCUMENTS 2685586  12/1991  France ............................. H04B 1/40

*Primary Examiner*—Michael Horabik
*Assistant Examiner*—Kevin C. Harper
*Attorney, Agent, or Firm*—Philip R. Wadsworth; Roger W. Martin; Tom Streeter

[57] ABSTRACT

A test equipment interface circuit capable of acting as an interface between a wireless transceiver and a piece of test equipment for both high frequency band signals and low frequency band signals without the use of active or mechanical switches.

6 Claims, 2 Drawing Sheets

6,125,107

DUAL-BAND RF TEST INTERFACE CIRCUIT

BACKGROUND OF THE INVENTION

I. Field of the Invention

The present invention relates to radio frequency (RF) test circuits for dual-band transceivers. More particularly, the present invention relates to a novel and improved dual-band RF test circuit for interfacing with a dual-band wireless communication device.

II. Description of the Related Art

In the field of RF testing, test equipment is generally connected to a unit under test via a test interface. The purpose of the test interface is to provide a proper impedance match, signal level, and connection of the unit under test to the test equipment. For example, a wireless transceiver such as a cellular or PCS-band telephone may be connected to RF test equipment during manufacture testing or repair in order to determine the "health" of the circuitry inside the wireless transceiver, and diagnose problems.

In the past, specialized test equipment interface circuits have been designed which are custom-tailored to the unit under test. For example, if the unit under test is a portable cellular telephone, then the test equipment interface circuit would be optimized to provide a proper match of the unit under test to the test equipment at cellular frequencies (i.e., frequencies in the 800 MHz range). On the other hand, if the unit under test is a portable PCS-band telephone, then the test equipment interface circuit would be optimized to provide a proper match of the unit under test to the test equipment at PCS-band frequencies (i.e., frequencies in the 1900 MHz range).

In a high-volume manufacturing and testing environment, where there may be a few different models of wireless transceivers being tested, each operating on a different radio frequency range, it is inefficient and costly to have separate RF test stations for each model of wireless transceiver when the only significant difference between their RF performance is that they are operating in different frequency bands. Thus, there is a need felt in the art to be able to test various models of wireless transceivers at the same test station, particularly if one of the models is a dual-band transceiver which itself is capable of operating on more than one frequency.

However, if multiple frequencies are to be tested at the same test station, the multiple types of test interfaces would also be needed; each optimized for its respective frequency band. It becomes time consuming, and thus costly to manually switch between these test interfaces in a high-volume testing environment.

One way to solve the problem of multiple test equipment interfaces is to use an active (i.e., powered) switch, or a mechanical switch, to switch between the various required interfaces. However, using active switches increases the complexity of the test setup because it requires power to be routed to the test equipment interface circuit. Thus, it would be advantageous to provide a test equipment interface circuit that does not require external power. Mechanical switches are also undesirable in a high-volume manufacturing environment because they tend to wear out very quickly. Moreover, they require that the operator of the test setup remember to operate the switch to change between the various test equipment interface circuits. Thus, it would be advantageous to provide a test equipment interface circuit that does not require a mechanical switch. In sum, what is needed is a test equipment interface circuit that is capable of operating on more than one frequency, but is easy to operate and efficient.

SUMMARY OF THE INVENTION

The test equipment interface circuit of the present invention is capable of acting as an interface between a wireless transceiver and a piece of test equipment for both high frequency band signals and low frequency band signals. For example, in the preferred embodiment, the test equipment interface circuit is capable of handling both PCS-band (i.e., 1900 MHz) signals and cellular band (i.e., 800 MHz) signals without the use of active or mechanical switches. The test equipment interface circuit accomplishes this dual-band functionality with passive components. By using passive components, the present invention avoids the reliability and efficiency considerations inherent in an active or mechanical switch.

The present invention is a novel and improved test equipment interface circuit. The circuit comprises a diplexer having a diplexer antenna port, a diplexer high band port and a diplexer low band port. A high band duplexer has a high band duplexer antenna port coupled to the diplexer high band port, and has a high band duplexer transmit port, and has a high band duplexer receive port. A low band duplexer has a low band duplexer antenna port coupled to the diplexer low band port, and has a low band duplexer transmit port, and has a low band duplexer receive port. A transmit combiner has a combiner high band port coupled to the high band duplexer transmit port, and has a combiner low band port coupled to the low band duplexer transmit port. A receive splitter has a splitter port, and has a splitter high band port coupled to the high band duplexer receive port, and has a splitter low band port coupled to the low band duplexer receive port.

In the preferred embodiment, the diplexer comprises a first transmission line having a first end coupled to the diplexer antenna port, and having a second end coupled to the diplexer low band port. A second transmission line has a first end coupled to the second end of the first transmission line and the diplexer low band port, and has a second end coupled to ground. A resonant tank circuit has a first end coupled to the diplexer antenna port and has a second end coupled to the diplexer high band port.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

Figure 1:
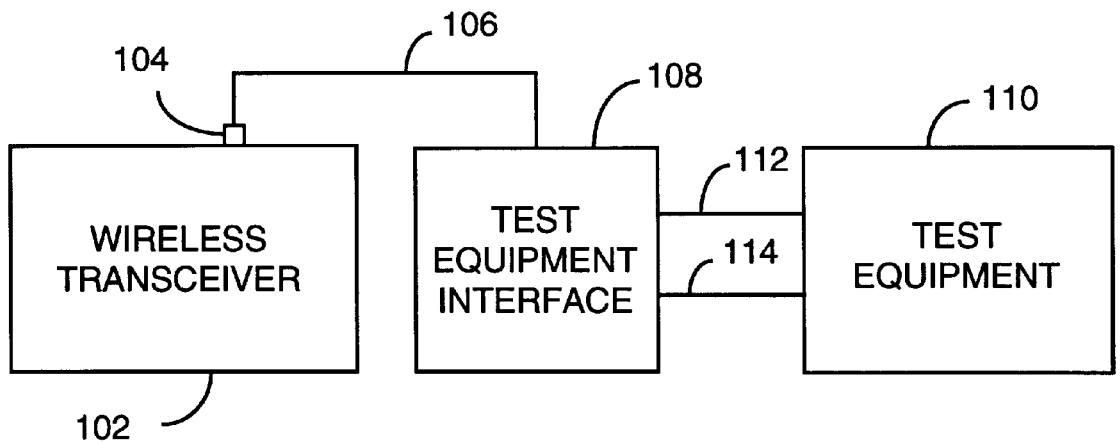
FIG. 1 is a high-level block diagram of the test equipment interface circuit of the present invention interfacing a wireless transceiver to a piece of test equipment.

In FIG. 1, a wireless transceiver 102 having an antenna port 104 is connected via test equipment interface circuit 108 to test equipment 110. Test equipment interface circuit 108 provides the proper impedance matching and connection between wireless transceiver 102 and test equipment 110. Wireless transceiver 102 may be, for example, a cellular band radiotelephone, or a PCS band radiotelephone, or a dual-band cellular and PCS band radiotelephone. Furthermore, wireless transceiver 102 may be any other type of wireless transceiver as is known in the art.

An RF coupling line 106 from antenna port 104 is connected as an input to test equipment interface circuit 108. On the transmit side, RF signals from wireless transceiver 102 are transmitted through antenna port 104, over the RF coupling line 106 to test equipment interface circuit 108. Test equipment interface circuit 108 filters the transmitted signal received over RF coupling line 106 and passes it to test equipment 110 over transmit line 112. Test equipment 110 may be any RF signal measurement equipment as is known in the art including a spectrum analyzer. For example, test equipment 110 may be a Marconi model 2026 manufactured by Rhode and Schwartz.

On the receive side, the test equipment 110 generates an RF signal intended for wireless transceiver 102 and transmits this signal over receive line 114. Test equipment interface circuit 108 filters this signal and passes it over RF coupling line 106 to wireless transceiver 102. In this manner, testing of the wireless transceiver 102 may be accomplished by test equipment 110.

Figure 2:
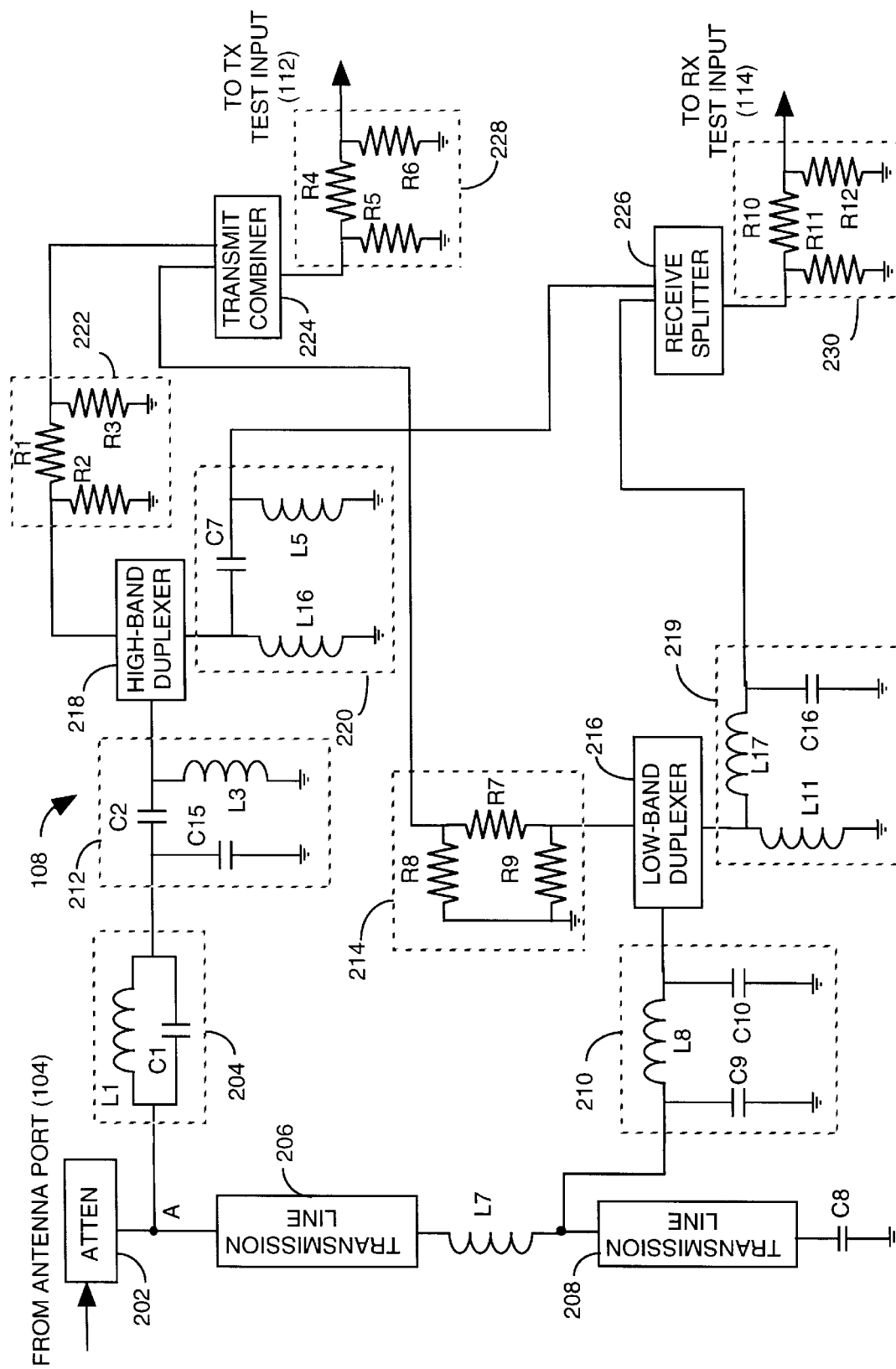
FIG. 2 is a circuit-level diagram of the test equipment interface circuit of the present invention.

Test equipment interface circuit 108 is shown in more detail in FIG. 2. As will be seen, test equipment interface circuit is capable of acting as an interface between wireless transceiver 102 and test equipment 110 for both high frequency band signals and low frequency band signals. For example, in the preferred embodiment, test equipment interface circuit 108 is capable of handling both PCS-band (i.e., 1900 MHz) signals and cellular band (i.e., 800 MHz) signals without the use of active or mechanical switches. Test equipment interface circuit 108 accomplishes this dual-band functionality with passive components.

In FIG. 2, attenuator (ATTEN) 202 may be coupled to the antenna port 104 of wireless transceiver 102. Signals received by attenuator 202 are attenuated, for example to be 3 dB. This attenuation provides proper isolation between the internal circuits of wireless transceiver 102 and the test equipment interface circuit 108. Signals received by attenuator 202 from wireless transceiver 102 are presented with two paths at node A. The upper path through resonant tank circuit 204 will be referred to herein as the high-band path. The lower path through transmission line 206 will be referred to herein as the low-band path. As will be seen, whether an RF signal passes through the high band path or the low band path depends on its frequency. In the preferred embodiment, the low band path is used as the interface path for cellular band signals, and the high band path is used as the interface path for PCS band signals.

Transmission line 208 in combination with capacitor C8 is tuned to be a short circuit at the high band frequency. For example, if the high band frequency is on the order of 1900 MHz, then the transmission line 208 will be approximately 0.192 inches in length, and C8 will be about 2.2 pf. As is known in the art, by shorting the PCS band frequencies to ground at one end of transmission line 206, the other end (closest to attenuator 202) will appear as a open circuit. Thus, transmission line 206, in combination with inductor L7, is tuned to be an open circuit at the high band frequency. For example, if the high band frequency is on the order of 1900 MHz, then the transmission line 206 will be approximately 0.24 inches in length and the inductor L7 will be about 5.6 nH. This prevents any PCS-band frequency signals from appearing at the antenna port of low band duplexer 216. However, low band frequency signals received by attenuator 202 will not be blocked by transmission line 206 and will be presented to the antenna port of low band duplexer 216.

On the high band path, resonant tank 204 is tuned to resonate at the low band frequency, thereby appearing as an open circuit at the low band frequency. For example, if the low band frequency is on the order of 800 MHz, then L1 would be approximately 15 nH, and C1 would be approximately 2.0 pf. Thus, resonant tank 204 prevents low-band frequency signals from appearing at the antenna port to high-band duplexer 218. However, high band frequency signals received by attenuator 202 will not be blocked by resonant tank 204 and will be presented to the antenna port of high band duplexer 218.

Thus, resonant tank 204, in combination with transmission line 206, inductor L7, transmission line 208 and capacitor C8 act as a diplexer, separating the low band transmit and receive signals from the high band transmit and receive signals. In other words, they serve to separate the high band path from the low band path.

Clearly, the component values of L7, C8, L1 and C1 may be changed in order to match the desired frequencies to be tested. Additionally, the lengths of the transmission lines 206 and 208 may be changed. Furthermore, it would be understood by one skilled in the art that the relative locations of resonant tank 204 and transmission line 206, L7, transmission line 208, and C8 may be swapped and appropriately tuned so that the resonant tank blocks the high frequencies rather than the low frequencies, and vice versa. Other variations and combinations will be readily apparent to one skilled in the art of diplexers.

At the antenna port to low-band duplexer 216 is a low band antenna matching network 210. In the preferred embodiment, this low band antenna matching network 210 is configured as a passive pi network comprising inductor L8, capacitor C9 and capacitor C10. Low band antenna matching network provides the proper impedance match to the antenna port of the low-band duplexer 216. In the preferred embodiment, the value of these components is selected to make a 50 ohm match.

Low band duplexer 216 separates the low-band transmit path through low band transmit attenuator 214 from the low band receive path through low band receive matching network 219. Low band duplexer 216 may be a suitable off-the-shelf duplexer such as part number DFY2R836CR881BHH made by Murata, or it may be a custom-specified part. Signals transmitted from wireless transceiver 102 are attenuated by low band transmit attenuator 214 which forms a stable matching circuit to compensate for the limitations of low band duplexer 216.

After being attenuated by low band transmit attenuator 214, the low band transmit signal is presented to transmit combiner 224 where it is combined with the high band transmit signal from the high band path, which will be discussed in more detail below.

At the antenna port to high band duplexer 218 is a high band antenna matching network 212. In the preferred embodiment, this high-band antenna matching network 212 is configured as a passive pi network comprising capacitor C2, capacitor C15, and inductor L3. High band antenna matching network 212 provides the proper impedance match to the antenna port 104 of the wireless transceiver 102. In the preferred embodiment, the value of these components is selected to make a 50 ohm match.

High band duplexer 218 separates the high-band transmit path through high band transmit attenuator 222 from the high band receive path through high band receive matching network 220. Like low band duplexer 216, high band duplexer 218 may be a suitable off-the-shelf duplexer, or it may be a custom-specified part. Signals transmitted from wireless transceiver 102 are attenuated by high band transmit attenuator 222 which forms a stable matching circuit to compensate for the limitations of high band duplexer 218. After being attenuated by high band transmit attenuator 222, the high band transmit signal is presented to transmit combiner 224 where it is combined with the low band transmit signal from the low band path. It should be noted, however, that typically only one path is providing significant signal energy to transmit combiner 224 at any one time.

The transmit signal output from transmit combiner 224 is further attenuated by transmit test input attenuator 228, which provides the proper impedance match between the test equipment interface circuit 108 and the test equipment 110 on the transmit line 112. Likewise, receive test input attenuator 230 provides the proper impedance match between the test equipment interface circuit 108 and the test equipment 110 on the receive line 114.

On the receive side, signals originating in test equipment 110 are attenuated through receive test input attenuator 230 and split by receive splitter 226 to the high band path and the low band path. On the low band path, low band receive matching network 219 provides the proper impedance match to the low band duplexer 216. Low band duplexer 216 then routes the received signal through low band antenna matching network 210. As discussed above, since transmission line 208 is a short at high-band frequencies, any high-band frequencies that appear at the antenna port to low band duplexer 216 will be shorted to ground through transmission line 208 and capacitor C8. Thus, only the low-band signal will be able to proceed on the receive side through the low band path.

Similarly, any low band signals that make it through high-band receive matching network 220, high-band duplexer 218 and high-band antenna matching network 212 will be blocked by resonant tank 204. Thus, only the high-band signal will be able to proceed on the receive side through the high-band path.

Thus, as can be seen from the above description, the present invention provides a test equipment interface circuit that is operable on two different frequency bands. Furthermore, the present invention allows testing of different wireless transceivers without requiring a mechanical or active switch, thus increasing the efficiency and decreasing the cost of testing. One skilled in the art would easily be able to design another test equipment interface circuit that is operable on more than two different frequency bands without departing from the teachings of the present invention. Additionally, one skilled in the art could combine the test equipment interface circuit with either the wireless transceiver or the test equipment itself without departing from the present invention.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

What is claimed is:

1. A test equipment interface circuit, comprising:
    a diplexer having a diplexer port, a diplexer high band port and a diplexer low band port;
    a high band duplexer having a high band duplexer antenna port coupled to said diplexer high band port, and having a high band duplexer transmit port, and having a high band duplexer receive port;
    a low band duplexer having a low band duplexer antenna port coupled to said diplexer low band port, and having a low band duplexer transmit port, and having a low band duplexer receive port;
    a transmit combiner having a combiner high band port coupled to said high band duplexer transmit port, and having a combiner low band port coupled to said low band duplexer transmit port; and
    a receive splitter having a splitter port, and having a splitter high band port coupled to said high band duplexer receive port, and having a splitter low band port coupled to said low band duplexer receive port.

2. A tester interface circuit, comprising:
    a diplexer having a diplexer port, a diplexer high band port and a diplexer low band port;
    a high band duplexer having a high band duplexer antenna port coupled to said diplexer high band port, and having a high band duplexer transmit port, and having a high band duplexer receive port;
    a low band duplexer having a low band duplexer antenna port coupled to said diplexer low band port, and having a low band duplexer transmit port, and having a low band duplexer receive port;
    a transmit combiner having a combiner high band port coupled to said high band duplexer transmit port, and having a combiner low band port coupled to said low band duplexer transmit port; and
    a receive splitter having a splitter port, and having a splitter high band port coupled to said high band duplexer receive port, and having a splitter low band port coupled to said low band duplexer receive port;
    wherein said diplexer comprises:
        a first transmission line having a first end coupled to said diplexer port, and having a second end coupled to said diplexer low band port;
        a second transmission line having a first end coupled to said second end of said first transmission line and said diplexer low band port, and having a second end coupled to ground; and
        a resonant tank circuit having a first end coupled to said diplexer port and having a second end coupled to said diplexer high band port.

3. A method of interfacing a signal between a dual-band transceiver and testing equipment, comprising the steps of:
    diplexing the signal into a high band component and a low band component;
    duplexing the high band component into a high band transmit component and a high band receive component;
    duplexing the low band component into a low band transmit component and a low band receive component;
    combining the high band transmit component and the low band transmit component into a combined transmit component; and
    splitting the high band receive component and the low band receive component from a combined receive component.

4. A method of interfacing a signal between a dual-band transceiver and testing equipment, comprising the steps of:
    diplexing the signal into a high band component and a low band component;

duplexing the high band component into a high band transmit component and a high band receive component;

duplexing the low band component into a low band transmit component and a low band receive component;

combining the high band transmit component and the low band transmit component into a combined transmit component; and splitting the high band receive component and the low band receive component from a combined receive component;

wherein said diplexing comprises applying the signal to:
- a first transmission line having a first end coupled to a diplexer port, and having a second end coupled to a diplexer low band port;
- a second transmission line having a first end coupled to said second end of said first transmission line and said diplexer low band port, and having a second end coupled to ground; and
- a resonant tank circuit having a first end coupled to said diplexer port and having a second end coupled to said diplexer high band port.

5. Apparatus for interfacing a signal between a dual-band transceiver and testing equipment, comprising:

means for diplexing the signal into a high band component and a low band component;

means for duplexing the high band component into a high band transmit component and a high band receive component;

means for duplexing the low band component into a low band transmit component and a low band receive component;

means for combining the high band transmit component and the low band transmit component into a combined transmit component; and means for splitting the high band receive component and the low band receive component from a combined receive component.

6. Apparatus for interfacing a signal between a dual-band transceiver and testing equipment, comprising:

means for diplexing the signal into a high band component and a low band component;

means for duplexing the high band component into a high band transmit component and a high band receive component;

means for duplexing the low band component into a low band transmit component and a low band receive component;

means for combining the high band transmit component and the low band transmit component into a combined transmit component; and means for splitting the high band receive component and the low band receive component from a combined receive component;

wherein said diplexing means comprises means for applying the signal to:
- a first transmission line having a first end coupled to a diplexer port, and having a second end coupled to a diplexer low band port;
- a second transmission line having a first end coupled to said second end of said first transmission line and said diplexer low band port, and having a second end coupled to ground; and
- a resonant tank circuit having a first end coupled to said diplexer port and having a second end coupled to said diplexer high band port.

* * * * *